United States Patent [19]

Anantha et al.

[11] 4,252,581

[45] Feb. 24, 1981

[54] SELECTIVE EPITAXY METHOD FOR MAKING FILAMENTARY PEDESTAL TRANSISTOR

[75] Inventors: Narasipur G. Anantha; Joseph R. Cavaliere, both of Hopewell Junction; Richard R. Konian; Gurumakonda R. Srinivasan, both of Poughkeepsie; Herbert I. Stoller, Wappingers; James L. Walsh, Hyde Park, all of N.Y.

[73] Assignee: International Business Machines Corporation, Armonk, N.Y.

[21] Appl. No.: 80,648

[22] Filed: Oct. 1, 1979

[51] Int. Cl.³ .................... H01L 21/20; H01L 21/302
[52] U.S. Cl. .................. 148/175; 29/576 E; 29/578; 29/580; 148/174; 357/20; 357/34; 357/50; 357/59; 357/88; 357/89; 427/86
[58] Field of Search .............. 148/174, 175; 29/576 E, 29/578, 580; 357/20, 34, 50, 59, 88, 89; 427/86

[56] References Cited

U.S. PATENT DOCUMENTS

| | | | |
|---|---|---|---|
| 3,312,881 | 4/1967 | Yu | 357/34 X |
| 3,489,622 | 1/1970 | Barson et al. | 148/187 |
| 3,582,724 | 1/1971 | Nakahara et al. | 148/175 X |
| 3,600,651 | 8/1971 | Duncan | 357/59 |
| 3,611,067 | 10/1971 | Oberlin et al. | 148/175 X |
| 3,671,340 | 6/1972 | Irie et al. | 148/187 |
| 3,709,746 | 1/1973 | DeWitt | 148/175 |
| 3,717,515 | 2/1973 | Ashar et al. | 148/175 |
| 3,796,613 | 3/1974 | Magdo et al. | 148/175 |
| 3,802,968 | 4/1974 | Ghosh et al. | 147/175 |
| 3,814,997 | 6/1974 | Takahashi et al. | 357/89 X |
| 3,826,698 | 7/1974 | Antipov et al. | 148/191 |
| 3,840,409 | 10/1974 | Ashar | 148/1.5 |
| 3,913,124 | 10/1975 | Roberson | 357/34 X |
| 4,016,596 | 4/1977 | Magdo et al. | 357/50 X |
| 4,082,571 | 4/1978 | Graul et al. | 148/1.5 |

OTHER PUBLICATIONS

Boss et al., "Simultaneous Diffusion . . . Polycrystalline & Monocrystalline Silicon," I.B.M. Tech. Discl. Bull., vol. 10, No. 2, Jul. 1967, pp. 164–165.
Magdo et al., "Fabricating Complimentary MOS Transistors," Ibid, vol. 15, No. 6, Nov. 1972, pp. 1767–1768.

*Primary Examiner*—R. Dean
*Assistant Examiner*—W. G. Saba
*Attorney, Agent, or Firm*—Robert J. Haase

[57] ABSTRACT

A method for making a bipolar filamentary pedestal transistor having reduced base-collector capacitance attributable to the elimination of the extrinsic base-collector junction. Silicon is deposited upon a coplanar oxide-silicon surface in which only the top silicon surface of the buried collector pedestal is exposed through the oxide. Epitaxial silicon deposits only over the exposed pedestal surface while polycrystalline silicon deposits over the oxide surface. The polycrystalline silicon is etched away except in the base region. An emitter is formed in the base region and contacts are made to the emitter, base and collector regions.

5 Claims, 8 Drawing Figures

SELECTIVE EPITAXY METHOD FOR MAKING FILAMENTARY PEDESTAL TRANSISTOR

BACKGROUND OF THE INVENTION

1. Field of the Invention

The invention generally relates to high performance bipolar pedestal transistors and, more particularly, to a method for making such transistors in which the intrinsic collector junction is very narrow and in which the extrinsic collector junction is substantially eliminated.

2. Description of the Prior Art

High performance bipolar transistors are known in which switching speed is greatly improved by the elimination of the extrinsic base-collector junction and the undesired capacitance associated with it. In the absence of base-collector capacitance domination, speed-power characteristics at lower power can be further improved by the reduction of the extrinsic base resistance. Such resistance reduction has been achieved by the provision of a low resistance, contiguous polycrystalline silicon base contacting member.

The foregoing techniques are disclosed in U.S. Pat. No. 3,796,613, issued to I. E. Magdo et al on Mar. 12, 1974, for "Method of Forming Dielectric Isolation For High Density Pedestal Semiconductor Devices" and assigned to the present assignee.

It is further advantageous that all of the foregoing considerations be accomplished in a manner permitting narrowing of the intrinsic collector junction so as to maximize device density in integrated chips. According to the technique disclosed in the aforementioned patent, silicon is deposited through an oxide layer which is apertured over the intrinsic collector region. Epitaxial growth results only in the exposed, recessed collector region, as desired, provided that the oxide window delineating said region is at least a certain size so that "bridging" can not occur. Although, ideally, no silicon should deposit on the raised oxide surrounding the collector region aperture, there remains a tendency to do so unless critical silicon deposition conditions are maintained reliably. Any undesired polycrystalline silicon deposits on the surrounding oxide tend to "bridge" over the aperture, preventing desired deposition within the aperture, especially where the aperture is made small for high component density.

SUMMARY OF THE INVENTION

A method for making a filamentary pedestal transistor is disclosed in which minimum base-collector capacitance is achieved along with reduced extrinsic base resistance for high performance in a manner compatible with minimum device area for high component density. The method comprises depositing silicon on a coplanar oxide-silicon surface in which only the top silicon surface of a buried collector pedestal is exposed through the oxide. Epitaxial silicon deposits only over the exposed pedestal surface while polycrystalline silicon deposits over the continguous oxide surface. The simultaneous epitaxial and polycrystalline silicon deposition over a coplanar surface inhibits bridging of the exposed pedestal surface by the polycrystalline silicon and allows the polycrystalline silicon to be used advantageously as a low resistance base contact. The polycrystalline silicon is etched away except in the base contact region. An emitter is formed in the base region and contacts are made to the emitter, base and collector regions.

DESCRIPTION OF THE PREFERRED EMBODIMENT

Figure 1:
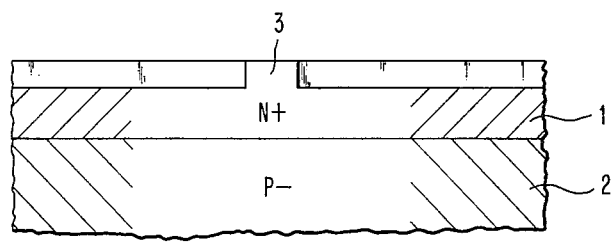
FIGS. 1–8 are simplified sectional views of the resulting structure existing at successive times during the execution of the method of the present invention.
Figure 2:
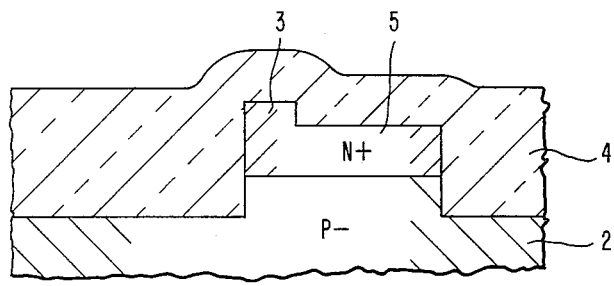

Referring to FIG. 1, a blanket N+ diffused subcollector 1 is formed in P− substrate 2 and the surface of the subcollector 1 is selectively etched away to form pedestal 3. Using a technique similar to those referred to in U.S. Pat. No. 4,139,442, issued to J. A. Bondur et al on Feb. 13, 1979 for "Reactive Ion Etching Method For Producing Deep Dielectric Isolation in Silicon" and assigned to the present assignee, deep dielectric-filled trench 4 is made. Briefly, trench 4 is formed by reactive etching to a depth penetrating through N+ layer of 1 of FIG. 1 to delineate subcollector region 5 of FIG. 2. The etched trench is filled by thermal oxidation alone or by a combination of thermal oxidation and pyrolitically deposited silicon oxide. In accordance with the present invention, however, the trench filling is continued until the entire collector pedestal structure is covered by oxide as shown in FIG. 2 to bring the minimum height of the oxide 4 above the height of the collector pedestal 3 as identified by the dashed line 6.

Figure 3:
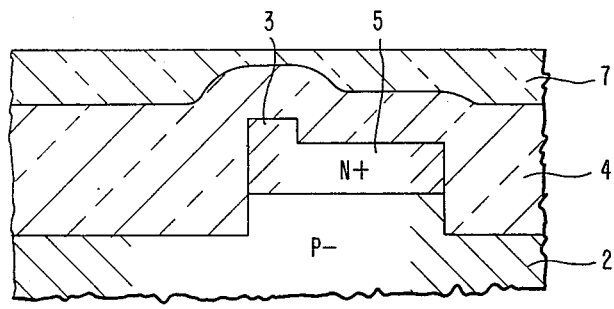

Photoresist layer 7 is spun over the surface of oxide 4 to planarize the surface of the resulting structure as depicted in FIG. 3. The photoresist preferably is polyimide having an etching rate of about 400 A/min. when using CF$_4$ reactive ion etching which is substantially equal to the etching rate of the oxide 4. Consequently, the surface of the structure remains planar as it is reactively ion etched away completely through the resist 7 and then into oxide 4. The etching is continued until the pedestal 3 is exposed and becomes coplanar with the surface of the remaining portion of oxide 4 as shown in FIG. 4.

Figure 4:
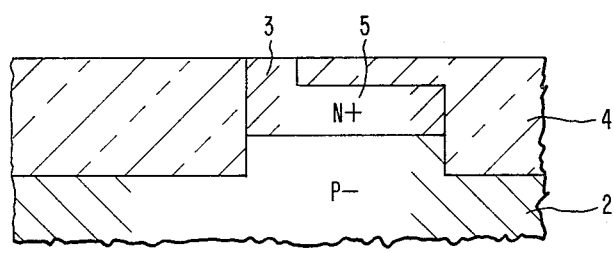
Figure 5:
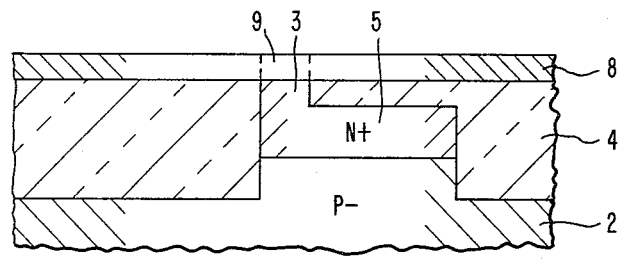

A layer of silicon 8 is deposited over coplanar surface of FIG. 4 to yield the structure of FIG. 5. Suitable pyrolytic epitaxial deposition techniques include (1) silane at about 1000° C. to about 1050° C. or (2) silicon tetrachloride at about 1050° C. Preferably, however, the silicon deposition is carried out using SiH$_2$Cl$_2$ at 1050° C. in hydrogen carrier gas. Under the above cited conditions, epitaxial silicon 9 deposits over exposed monocrystalline pedestal 3 while polycrystalline silicon deposits elsewhere in layer 8. Epitaxial silicon 9 forms in the intrinsic base region while the polycrystalline silicon portion of layer 8 forms the extrinsic base contact region of the NPN pedestal transistor being fabricated. Accordingly, the silicon layer 8 can be p-doped during the deposition process or, alternatively, the layer can be p-doped after the deposition has been completed, as is well understood in the art.

Figure 6:
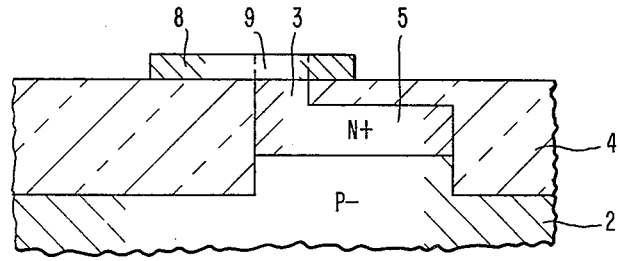
Figure 7:
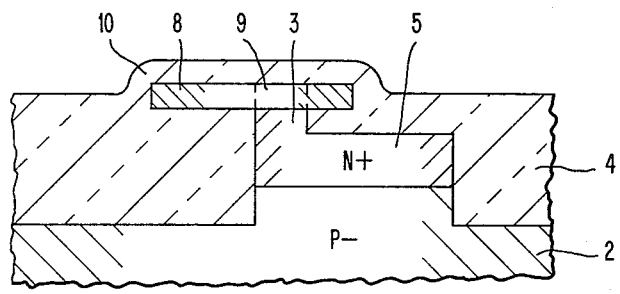
Figure 8:
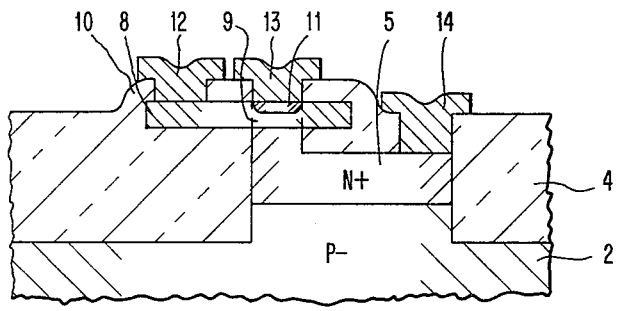

The intrinsic base region 9 and the extrinsic base contact region are delineated by etching away the excess silicon layer 8 to yield the structure of FIG. 6. Then, oxide 10 is grown to cover the remaining silicon layer 8, including the intrinsic base region 9, as depicted in FIG. 7. Using a block-out mask over the extrinsic base region, an emitter diffusion or ion implant is made in the intrinsic base region 9 to form emitter 11. Finally, metal contacts 12, 13 and 14 are made to the extrinsic base region, to the emitter region and directly to the subcollector region, respectively, after corresponding windows are etched through the overlying oxide as is well understood.

By virtue of the doped polysilicon layer 8, a low extrinsic base resistance is provided between base contact 12 and intrinsic base region 9. Inasmuch as the base-collector junction is confined by recessed oxide 4 to the narrow pedestal region 3, directly beneath the intrinsic base region 9, the extrinsic base-collector junction has been eliminated along with its unwanted junction capacitance. The net result is improved speed-power performance for the NPN filamentary (very thin active region) pedestal transistor.

Having thus described my invention, what I claim as new, and desire to secure by Letters Patent is:

1. The method comprising:
   providing a monocrystalline silicon substrate,
   etching said substrate to form a pedestal,
   depositing silicon oxide over said substrate to a thickness greater than the height of said pedestal,
   planarizing the deposited silicon oxide over said substrate so as to expose said pedestal whereby there is provided
   a substantially coplanar silicon oxide-monocrystalline silicon surface containing a buried collector pedestal, only the top surface of said pedestal being exposed,
   said top surface of said pedestal and the top surface of said oxide being substantially coplanar,
   simultaneously depositing silicon on said top surface of said pedestal and on said top surface of said oxide to form epitaxial silicon over said pedestal and polycrystalline silicon over said oxide,
   forming an intrinsic base region in said epitaxial silicon and an extrinsic base region in said polycrystalline silicon, and
   forming an emitter region in said intrinsic base region.

2. The method defined in claim 1 wherein the step of providing said substantially coplanar silicon oxide-monocrystalline silicon surface comprises
   providing a monocrystalline silicon substrate of one conductivity type,
   forming a buried subcollector of opposite conductivity type in said substrate,
   said subcollector having a pedestal portion, and
   forming recessed silicon oxide in said substrate contiguous to said subcollector,
   the top surface of said recessed oxide and the top surface of said pedestal portion being substantially coplanar.

3. The method defined in claim 2 wherein the step of forming said recessed silicon oxide in said substrate contiguous to said subcollector comprises
   forming recessed oxide in said substrate adjacent to both ends of said subcollector and on top of said subcollector, except at the location of said pedestal portion.

4. The method defined in claim 1 wherein the step of forming said extrinsic base region comprises etching away said polycrystalline silicon except in said base region.

5. The method defined in claim 1 wherein the step of providing said substantially coplanar silicon oxide-monocrystalline silicon surface comprises
   providing a monocrystalline silicon substrate of one conductivity type,
   forming a buried subcollector of opposite conductivity type in said substrate,
   said subcollector having a pedestal portion, and
   forming recessed silicon oxide in said substrate contiguous to said subcollector,
   the top surface of said recessed oxide and the top surface of said pedestal portion being substantially coplanar, and
   wherein the step of forming said extrinsic base region comprises etching away said polycrystalline silicon except in said base region.

* * * * *